(12) United States Patent
Pluymers et al.

(10) Patent No.: US 6,469,671 B1
(45) Date of Patent: Oct. 22, 2002

(54) LOW-TEMPERATURE-DIFFERENCE TR MODULE MOUNTING, AND ANTENNA ARRAY USING SUCH MOUNTING

(75) Inventors: Brian Alan Pluymers, Haddonfield, NJ (US); Robert Michael Reese, Philadelphia, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/905,834

(22) Filed: Jul. 13, 2001

(51) Int. Cl.[7] .............................. H01Q 1/24; H01Q 1/38
(52) U.S. Cl. ................... 343/702; 343/700 MS
(58) Field of Search ................... 343/702, 700 MS, 343/853, 850; 342/70, 71, 72, 175

(56) References Cited

U.S. PATENT DOCUMENTS

| | | | |
|---|---|---|---|
| 5,459,474 A | * 10/1995 | Mattioli et al. | 343/702 |
| 5,724,042 A | * 3/1998 | Komatsu et al. | 342/175 |
| 5,995,049 A | * 11/1999 | Komatsu et al. | 343/700 MS |

* cited by examiner

*Primary Examiner*—Tan Ho
*Assistant Examiner*—Hoang Nguyen
(74) *Attorney, Agent, or Firm*—Duane Morris LLP (57) ABSTRACT

A generally planar active array antenna includes a plurality of transmit-receive (TR) modules arrayed in an array direction on a generally planar heat-conducting baseplate of a line-replaceable unit (LRU). Heat is coupled from the TR modules to their associated baseplate. Each baseplate of an LRU has a straight edge parallel to the array direction of the modules. In a preferred embodiment, the modules are located adjacent the straight edge without significant intermediary components. The LRUs are arrayed with their straight edges lying in a plane. The straight edges are coupled to a generally planar cold plate for extracting heat from the baseplates. Since the heat is extracted in a direction orthogonal to the arraying direction of the modules, all the modules tend to have the same operating temperature. In a particularly advantageous embodiment, the circulators associated with each TR module are mounted on the opposite side of the cold plate relative to the module, to thereby minimize the thermal path length between each module and the cold plate.

2 Claims, 9 Drawing Sheets

LOW-TEMPERATURE-DIFFERENCE TR MODULE MOUNTING, AND ANTENNA ARRAY USING SUCH MOUNTING

FIELD OF THE INVENTION

This invention relates to the mounting of transmit/receive (TR) modules in arrays with cooling optimized for minimum temperature difference between modules.

BACKGROUND OF THE INVENTION

A great deal of commerce is currently aided by the use of electromagnetic communication, and electromagnetics are widely used for sensing, as for example in radar systems. Such radar systems may be used for monitoring the flight path of an aircraft from the aircraft itself for weather and object monitoring, monitoring the airspace around an airport for traffic control purposes, distance and acceleration monitoring between automobiles, and for military purposes. Reflector-type antennas have been, and still are, widely used for obtaining the high gain desired for communication with distant locations, and to obtain a narrow radar antenna beam to allow objects to be located with more precision than if a broad antenna beam were used. Reflector-type antennas are subject to some disadvantages, especially when the antenna beam must be scanned rapidly. Since the direction of the antenna beam as generated by a reflector antenna depends upon the physical position of the reflector, the reflector itself must be physically moved in order to scan the antenna beam. For simple area surveillance, this is not a problem, because the reflector antenna can simply be rotated at a constant speed to recurrently scan the surrounding area.

In those cases requiring antenna beam agility, reflector antennas are less satisfactory, because the inertia of the antenna results in the need to apply large forces to obtain the necessary accelerations and decelerations. In addition to being costly to operate, the physical stresses on the structure tend to lead to early failure or increased need for maintenance.

As a consequence of these and other disadvantages of reflector-type antennas, attention has been given to the use of array antennas, in which multiple antenna elements or ant elements are arrayed to define a larger radiating aperture, and fed from a common source. In order to achieve beam agility, each antenna element (or groups of antenna elements) are associated with controllable phase shifters. In order to improve the range of the communications or of the radar using the phase-shift-controllable array antenna, each antenna element may be associated with a power amplifier, a low-noise receiving amplifier, or both. The combination of the controllable phase shifter for each antenna element, the low-noise receiving amplifier, and the power amplifier, are often combined into a "transmit-receive" (TR) module, together with various switch and control elements, so that modular electronics can be used with the modular antenna elements of the array. U.S. Pat. No. 3,339,086, issued Aug. 16, 1994 in the name of DeLuca et al. describes a phased array antenna in which each elemental antenna element is associated with a transmit/receive (TR) module, but does not describe the physical nature of the structure.

With the increasing range and performance requirements of modern equipments, the power-handling capabilities of the power amplifiers of each of the TR modules of an array antenna have tended to increase. The reliability of electronic equipment tends to be degraded by operation at high temperatures. The increase in power required to be handled by the power amplifiers of TR modules, in turn, leads to the problem of carrying away the additional heat associated with the higher power, so as to keep the electronics at a low, and therefore reliable, temperature. U.S. Pat. No. 5,459,474, issued Oct. 17, 1995 in the name of Mattioli et al. describes an array antenna in which the electronics associated with a column of arrays are in the form of TR modules mounted on a coolant-fluid-carrying cold plate of a slide-in carrier. In the Mattioli et al arrangement, each slide-in carrier has a width no greater than the spacing between adjacent antenna elements. Heat is carried away from each slide-in carrier by coolant flow through a set of hoses, which allow the carriers to be slid toward and away from the antenna array for maintenance. The mounting of a large number of TR modules directly to the cold plate may be disadvantageous, as the entire cold plate must be taken out of service in order to work on or replace a single TR module. The changing out of a defective TR module is complicated by the mechanical fasteners and thermal joining material, or the epoxy bond, often used to provide good physical and thermal mounting of the TR module to the cold plate.

It is desirable to mount small numbers of the TR modules on Line-Replaceable Units (LRUs), which in turn are mounted to the cold plate. The number of TR modules which are mounted on each LRU depends upon a number of factors, among which one major factor is the availability of small-volume, efficient, reasonable-cost power supplies. That is to say, LRUs with but a single TR module may require a power supply which has excess capability for that one TR module, and an array of such LRUs would therefore contain more volume of power supplies than needed. Since volume is a consideration in an array situation, one TR module per LRU might be considered to be undesirable. Similarly, a very large number of TR modules on a single LRU tends to reduce the advantage of a line-replaceable unit, as removal of the LRU takes a large number of TR modules off-line, to the detriment of array operation. With such an arrangement, maintenance on a single TR module can be effected by simply replacing the LRU requiring repair or maintenance with a replacement unit, whereupon the maintenance can be performed off-line while the electronic system or radar continues in operation. Even with the LRU missing, the array can still remain in operation although with degraded capability.

Figure 1:
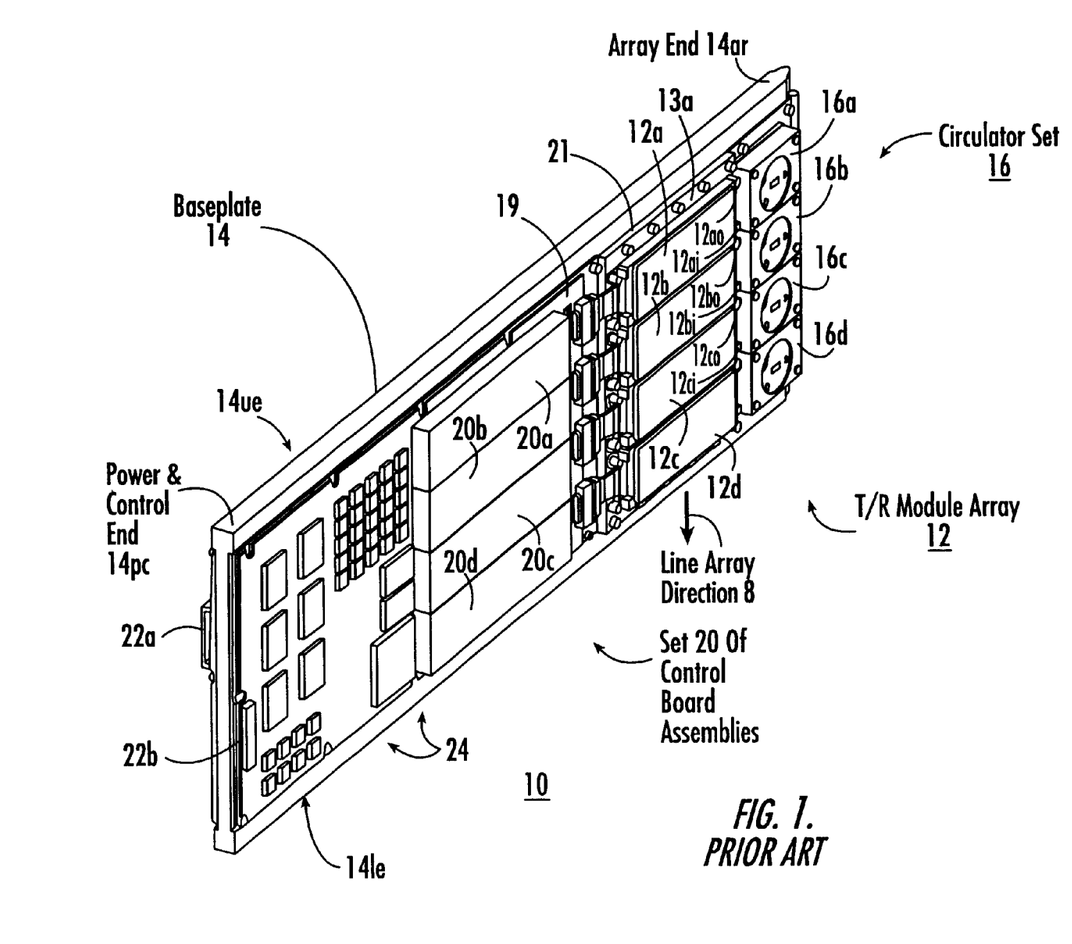
FIG. 1 is a simplified perspective or isometric view of a line replaceable unit (LRU) of the prior art, including a thermally conductive baseplate on which four transmit/receive modules are mounted, together with their associated circulators.

FIG. 1 is a simplified perspective or isometric view of an arrangement in which the TR modules are mounted on a Line Replaceable Unit (LRU) 10 in groups of four. As illustrated in FIG. 1, the set 12 of TR modules 12, 12b, 12c, and 12d is mounted in a vertical line array parallel with an array direction represented by arrow 8, near the antenna-array end 14ar on a vertically-oriented thermally conductive baseplate 14. Each module of set 12 includes an RF power output port, some of which are designated 12ao, 12bo, and 12co, and also includes an RF signal input port, some of which are designated as 12ai, 12bi, and 12ci. Lying between each TR module 12a, 12b, 12c, and 12d and the antenna-array end 14ar of the baseplate 14 is a circulator 16a, 16b, 16c, and 16d, respectively, of a set 16 of circulators. Each circulator includes an antenna element coupling port coupled to a connector (not illustrated) mounted adjacent the antenna-array end 14ar of the baseplate 14, for providing a connection to the associated antenna element, and also includes two further coupling ports, which are coupled by paths (not illustrated) to the transmit or output and receive or input ports of the modules of set 12, for coupling to amplifiers of each TR module. Thus, when the LRU 10 of FIG. 1 is slid into place in its mounting behind the array antenna, in a manner generally similar to that of the above-mentioned Mattioli et al. patent, each circulator of set 16 of circulators provides a path from the power amplifier (not illustrated) of the associated TR module to the antenna element, and from the antenna element to the receive amplifier (not illustrated) of the TR module.

In addition to the set 12 of TR modules, the baseplate 14, and the set 16 of circulators, LRU 10 of FIG. 1 illustrates a set 20 of control board assemblies 20a, 20b, 20c, and 20d mounted on a printed-circuit board 19 supported by baseplate 14, for controlling the various parameters of the corresponding TR modules, such as the phase shift, gain or attenuation, and the like, under control from a remote antenna control computer (not illustrated) coupled to connectors 22a and 22b, located near or at the power-and-control end 14pc of the baseplate 14. Other electronic components, designated together as 24, may be mounted on printed-circuit board 19.

While only four TR modules are illustrated as being mounted on the illustrated side of baseplate 14 of FIG. 1, another complete set of components, including circulators, TR modules, control board assemblies, and additional components, may be mounted on the reverse side (not visible in FIG. 1) side of the baseplate 14.

As mentioned, the power amplifier portions of the TR modules of set 12 of TR modules of FIG. 1 (and the power amplifiers of additional TR modules mounted on the reverse side of the baseplate 14, if such exist) are the major (although not the only) sources of heat on LRU 10. However, similar problems exist in LRUs which provide power-supply service under similar conditions. Thus, heat must be coupled away from the TR modules in order to maintain them at a temperature sufficiently low to provide the desired reliability. In an LRU such as that of FIG. 1, the heat from each TR module of set 12 flows from a substantially planar surface, such as surface 13a of the TR module (possibly through a printed-circuit board 21) to thermally conductive baseplate 14. In prior-art arrangements, a clear region 14ue is provided adjacent the upper edge of baseplate 14, and a corresponding clear region 14le is provided adjacent the lower edge of the baseplate 14. Upper and lower clear regions 14ue and 14le, respectively, are provided so that baseplate 14 can be clamped to a cold plate to provide both mechanical support and a thermal sink.

Figure 2:
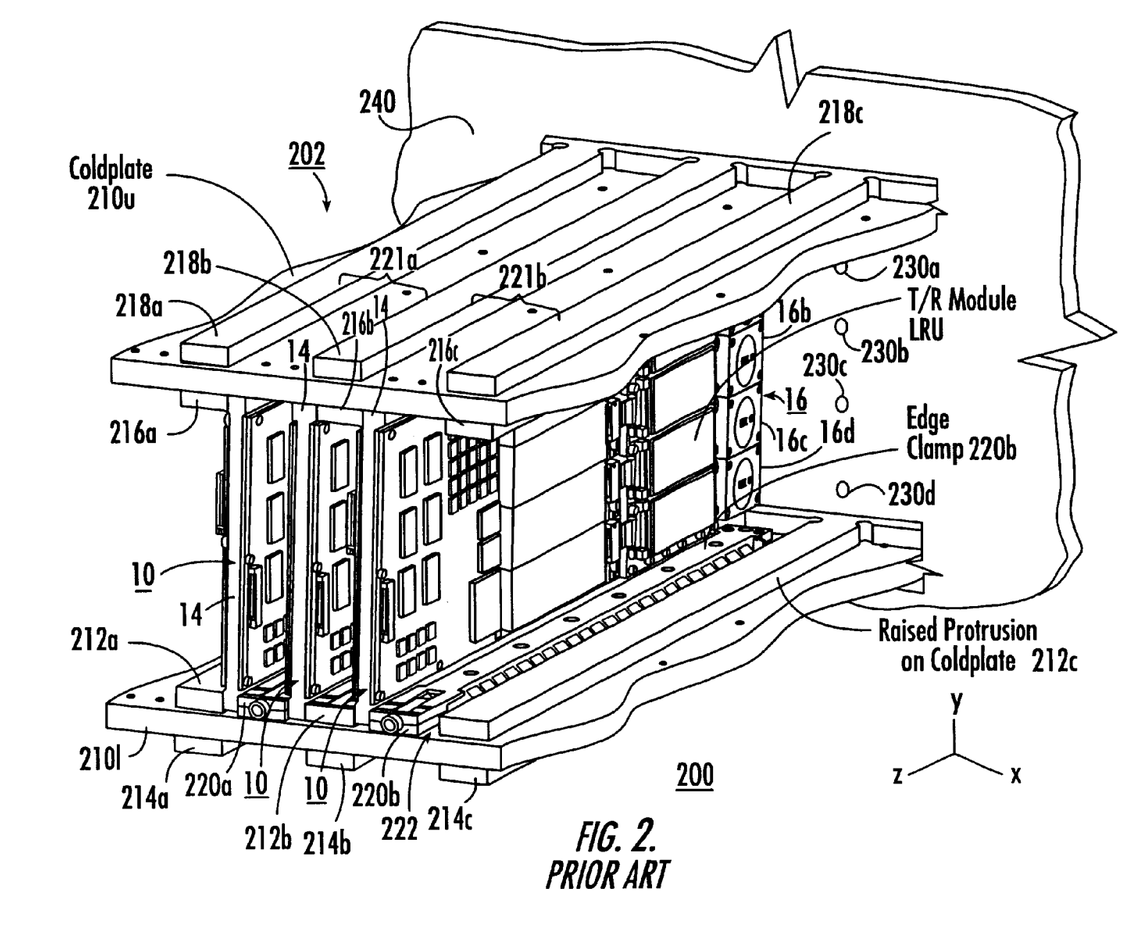
FIG. 2 is a simplified perspective or isometric view of a portion of a prior art antenna array, including a plurality of LRUs similar to that of FIG. 1, a physical mounting for arraying the LRUs and for coupling heat from the baseplates thereof, and also showing a ground structure for the antenna array, and apertures in the ground structure for each antenna element of the array.

FIG. 2 illustrates three TR LRUs mounted in a portion of a cold-plate structure located adjacent to, and behind (on the antenna feed side of) an antenna array structure. In FIG. 2, the structure 200 includes a portion of a ground plane 240 of the array antenna structure, which defines a set 230 including a plurality of feed apertures, some of which are illustrated as 230a, 230b, 230c, and 230d. The feed apertures of set 230 are provided for coupling electromagnetic energy from the circulators of the TR modules of a line replaceable unit (LRU) to the antenna elements (not illustrated) lying behind ground plane 240. Each aperture of set 230 either includes an electromagnetic transmission line, or is dimensioned to accommodate such a transmission line. A vertical array of such apertures is associated with each vertical array of circulators of each LRU. The structure 200 of FIG. 2 also includes an LRU support and cooling structure, the illustrated portion of which is designated generally as 202. The support and cooling structure 202 which includes a portion of a support and cooling structure 202 includes an upper cold plate 210u and a lower cold plate 210l. As used herein, the term "cold plate" means a plate or structure through which coolant fluid is circulated or flows to carry away heat coupled to the cold plate.

Lower cold plate 210l of FIG. 2 defines a plurality of thermally conductive elongated bosses or raised protuberances 212a, 212b, and 212c, and additional bosses 214a, 214b, and 214c. Similarly, upper cold plate 210u defines a plurality of elongated bosses or raised protrusions 216a, 216b, and 216c, and additional bosses 218a, 218b, and 218c. Each mutually adjacent pair of such bosses defines a gap or space therebetween. For example, mutually adjacent or mutually facing bosses 218a and 218b define a gap or space designated 221a, and a corresponding gap 221b is defined between bosses 218b and 218c. These gaps have predetermined dimensions, and more particularly are dimensioned to accommodate the thickness of two baseplates 14 of TR modules such as modules 10 of FIGS. 1 or 2, and the additional thickness or width of an edge clamp, two of which are illustrated in FIG. 2 as 220a and 220b.

As illustrated in FIG. 2, the gap between bosses 212a and 212b contains the lower edges of the baseplates 14 of two adjacent LRUs 10, and one edge clamp designated 220a. The baseplates 14 of the two LRUs 10 lie immediately adjacent to, and ideally in intimate thermal contact with, the bosses 212a and 212b. The edge clamp 220a is a mechanically expandable device corresponding in principle to a mechanical jack, centrally located between its associated bosses. In the absence of an LRU, a gap having about the thickness of the baseplate of an LRU exists between the edge clamp and an adjacent boss, as indicated in FIG. 2 by the gap or slot 222 lying between boss 212c and edge clamp 220b. Each edge clamp can be loosened or contracted to provide more or less space between itself and the adjacent walls of the bosses; in the context of edge clamp 220b, the transverse dimension of slot or gap 222 can be slightly changed by expansion or contraction of the width of edge clamp 220b. The edge clamp is contracted to provide for clearance in order to allow ready insertion of the LRUs into the structure, and then forced toward its expanded state in order to force the installed LRUs against the walls of the adjacent bosses, to thereby improve the thermal contact at the interface between the bosses and the LRU baseplates. A low thermal resistance is desirable at the interface, to thereby tend to reduce the temperature of the baseplates 14 toward the temperature of the cold plate in the vicinity of the LRU. The pressure exerted by the edge clamp in order to provide low thermal resistance may be quite high, so the edge clamp requires substantial mechanical advantage. In one embodiment, the mechanical advantage is provided by a longitudinal screw extending through the length of the edge clamp, together with overlapping inclined planes or ramps which are forced together by rotation of the screw. As known, thermally conductive grease or other material may be added to the interface in order to aid in reducing the thermal resistance at the interface.

It will be understood that edge clamps are also used between mutually adjacent LRUs along the top edges of their baseplates, as well as along the bottom edges, as illustrated in FIG. 2. It will also be understood that the three LRUs illustrated in FIG. 2 are merely a few of those which may be found in an active antenna array system, and the support structure 202 will ordinarily provide for access for additional LRUs. Thus, the bosses or protuberances 218a, 218b, and 218c provide for mounting and heat transfer for the lower edges of the baseplates of additional LRUs situated above the illustrated LRUs, and similarly the additional bosses 214a, 214b, and 214c lying under cold plate 210l provide for mounting and heat transfer to yet other LRUs lying below the illustrated LRUs. Also, the structure 202 of FIG. 2 will ordinarily extend to the right and to the left, as seen in FIG. 2, to provide for further arrayed LRUs.

Figure 3:
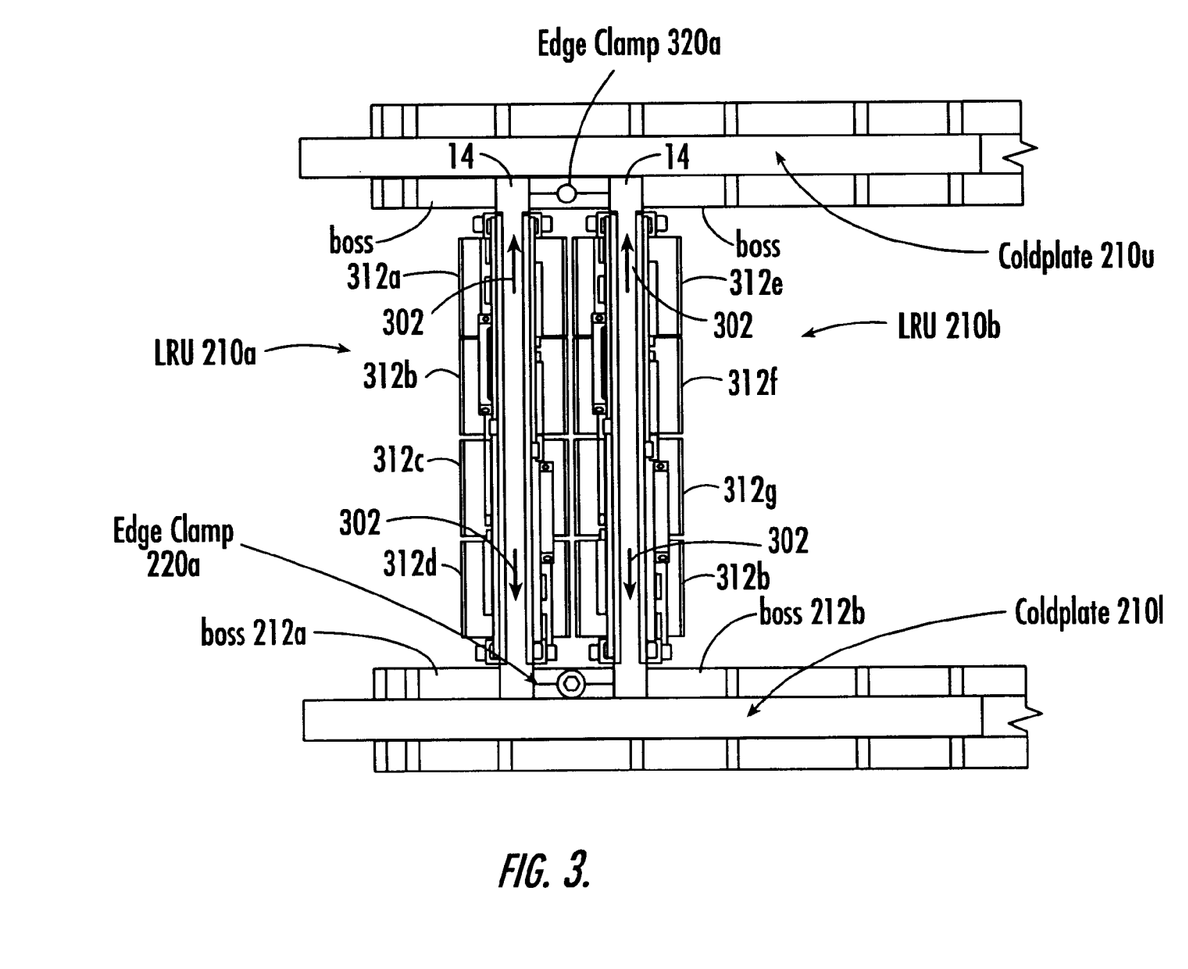
FIG. 3 is a simplified cross-sectional or end view of a portion of the structure of FIG. 2, illustrating heat flow paths.

FIG. 3 is a simplified cross-sectional or end view of a portion of the structure of FIG. 2, illustrating two mutually adjacent LRUS, designated 210a and 210b, both of which are held in place by edge clamps 220a and 320a. In FIG. 3, there are TR modules mounted on both sides of the baseplates 14 of the LRUs 210a and 210b. More specifically, the left side of LRU 210a supports TR modules 312a, 312b, 312c, and 312d, and the right side of LRU 210a supports other TR modules, which are not separately designated. Similarly, the left side of LRU 210b supports four TR modules which are not separately designated, and also supports, on its right side, and additional four TR modules, which are designated 312e, 312f, 312g, and 312h. One of the advantages of a structure such as that described in conjunction with FIGS. 1, 2, and 3 is that the LRUs can be removed for maintenance without excessively disrupting normal operations, and an additional advantage is that such removal of the LRUs can be accomplished without making and breaking coolant flow paths.

Improved array antenna structures are desired.

SUMMARY OF THE INVENTION

An active array antenna according to an aspect of the invention includes a plurality of RF modules having at least transmit capability. Each of the modules, when energized, generates heat, and transfers the heat to a generally planar mounting and heat transfer surface of the module. The active array antenna also includes a plurality of thermally conducting, generally planar mounting and heat transfer plates, each of which mounting and heat transfer plates defines at least one generally straight edge. Each of the mounting and heat transfer plates includes mounting positions for at least three of the modules. These mounting positions are arrayed in a straight line parallel to the straight edge, whereby, if heat is extracted from the mounting and heat transfer plates in a direction collinear with the straight-line array, those of the modules nearest the heat extraction regions will have a lower temperature than others of the modules more remote from the heat extraction regions. The active array antenna includes a mounting structure for mounting the plurality of generally planar mounting and heat transfer plates in a side-by-side array, with the straight edges of the mounting and heat transfer plates lying in a plane. A generally planar cold plate abuts and is in thermal contact with the straight edges of the mounting and heat transfer plates, for extracting heat from the mounting and heat transfer plates in a direction orthogonal to the array direction, which thereby tends to maintain all of the modules at the same temperature.

In a particular embodiment of the invention, each of the modules includes at least an RF output port, and the mounting and heat transfer plates include RF coupling means, for coupling RF from (a) the positions of the RF output ports of the modules associated with the heat transfer plate when the modules are mounted at the mounting locations to (b) locations adjacent the straight edge of the mounting and heat transfer plate.

DESCRIPTION OF THE INVENTION

It has been discovered that the operation of antenna systems such as those described in conjunction with FIGS. 1, 2, and 3 is not as predicted, and at least a portion of the difference between the predicted operation and the actual operation is attributable to temperature differences between the various power amplifiers of the TR modules of an LRU. Referring to FIG. 3, it will be noted that each LRU 210a, 210b (and, of course, any others similarly mounted) has heat generated by the components within each TR module. The TR modules are mounted in a vertical (as seen in FIG. 3) array, and the heat is extracted from the baseplates 14 at their upper and lower edges, which results in flow of heat in the direction indicated by arrows 302. As a result, a greater thermal resistance exists between the two middle or central TR modules of each vertical array and the edge at which heat is extracted, as for example a greater path length exists between TR modules 312b and 312c and the upper and lower edges of baseplate 14, than between TR modules 312a and 312d and the upper and lower edges. This increased thermal resistance would alone result in a higher temperature of the two central or "inner" TR modules 312b, 312c of LRU 210a relative to the two "outer" TR modules 312a, 312d. This temperature difference, in turn, leads to performance differences, in that the gain and phase shift of the TR modules may differ in a systematic manner attributable to the temperature difference. In addition to the difference in thermal path length or resistance, that portion of the thermal path between the centrally located or inner TR modules which is also used by the outer TR modules results in a further temperature rise at the inner modules, thereby exacerbating the operational differences between the inner and outer TR modules. This problem exists when more than two TR modules are arranged in an array, as for example in the arrangement of four TR modules illustrated in FIGS. 1, 2, and 3, and the heat is extracted in the direction of the array. The problem of differences among the most centrally located and the outermost TR modules increases when more TR modules are mounted in the array, as for example when an LRU includes a line array of six TR modules. According to an aspect of the invention, the cold plate which extracts heat from the LRU is located between the TR modules and the antenna array, so that the heat is extracted from all of the TR modules through the same path length and ideally through equal thermal resistances. According to another aspect of the invention, the circulators are moved from the LRU to the other side of the cold plate, so as to allow the TR modules of the LRU to be as close as practicable to the cold plate. This relocation requires that two electromagnetic paths through the cold plate be provided for each TR module, by contrast with the single electromagnetic path required in the case of the structure of FIGS. 1, 2, and 3.

Figure 4A:
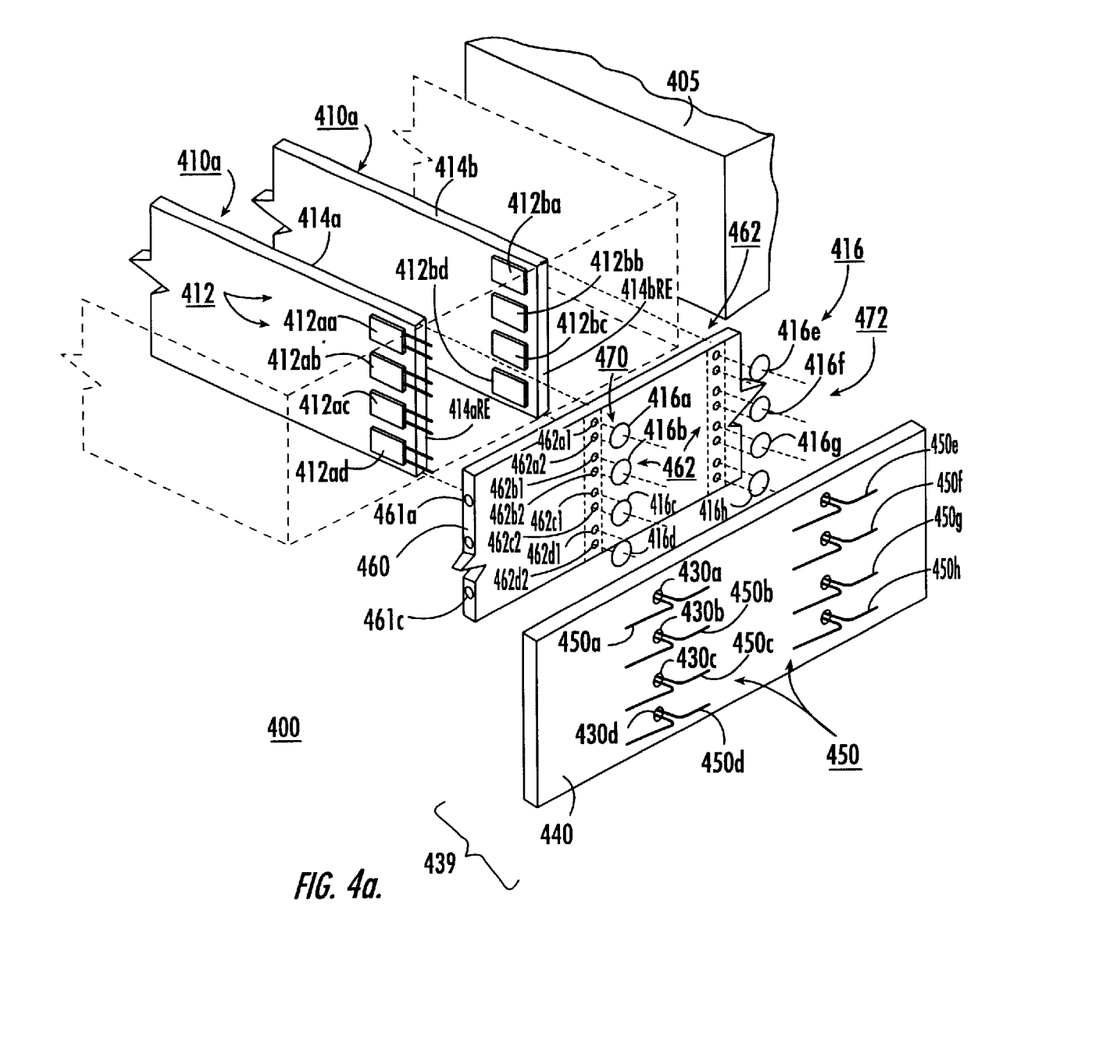
FIG. 4a is a simplified, conceptual, exploded perspective or isometric view of an antenna array in accordance with an aspect of the invention.

FIG. 4a is an exploded, perspective or isometric view of a portion of an antenna array according to these two aspects of the invention, simplified to the point of being conceptual. In FIG. 4a, a portion of an active antenna array is illustrated as a structure 400. Structure 400 includes an array antenna 439 including a vertically-oriented planar antenna ground structure 440 and a set is 450 of antenna elements including plurality of antenna elements which are illustrated as being in the form of dipoles, some of which are designated 450a, 450b, 450c, and 450d, arranged in a rectangular array. As in the case of ground plane 240 of FIG. 2, a single aperture or transmission line extends through the ground plane 440 of FIG. 4a for each antenna element of set 450. More particularly, an aperture or transmission line 430a is associated with dipole antenna 450a, an aperture or transmission line 430b is associated with dipole antenna 450b, an aperture or transmission line 430c is associated with dipole antenna 450c, and an aperture or transmission line 430d is associated with dipole antenna 450d. Naturally, the same pattern obtains over the entire antenna array.

FIG. 4a also illustrates line replaceable units (LRUS) 410a and 410b, from among all the LRUs in the system. LRUs 410a and 410b have thermally conductive baseplates 414a and 414b, respectively, to which the heat from TR module arrays is coupled. Baseplates 414a and 414b may be considered to be portions of a set 414 of baseplates. In FIG. 4a, the planes of the baseplates 410a and 410b are mutually parallel, and vertically oriented in planes orthogonal or perpendicular to the plane of ground structure 440. Each LRU 410a and 410b includes a vertically oriented array of four TR modules, all of which TR modules lie on the baseplate 414a, 414b, respectively, substantially equidistant from that edge of the baseplate which is closest to the antenna array ground plane 440. As illustrated in FIG. 4a, the TR modules are not separated from those edges by an array of circulators. More particularly, LRU 410a includes a baseplate 414a defining an edge 414aRF. The suffix RF is used to indicate that ordinarily, this is the edge of the baseplate by which power RF signals are transferred from the power amplifiers of the TR modules to the circulators. Edge 414aRF of baseplate 414a is the edge of baseplate 414a lying closest to RF ground plane 440 and to the antenna array including antenna elements 450a, 450b, 450c, and 450d. Similarly, LRU 410b includes a baseplate 414b defining an edge 414bRF. Edge 414bRF of baseplate 414b is the edge of baseplate 414b lying closest to RF ground plane 440 and to the antenna array including antenna elements 450e, 450f, 450g, and 450h. A mounting structure, a portion of which is illustrated as 405, supports the array antenna support 440, the cold plate 460, and the various LRUs of FIG. 4a.

Figure 4B:
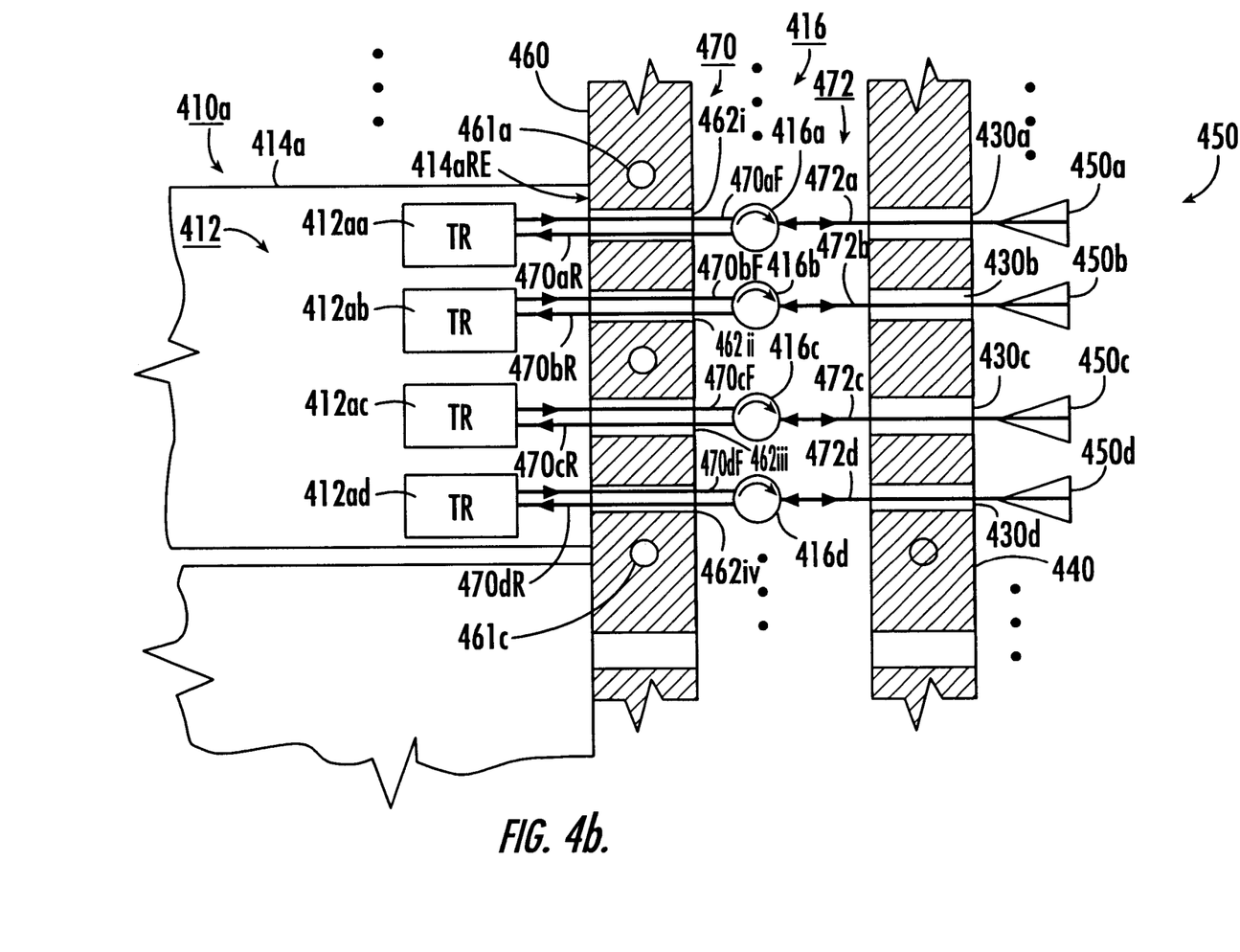
FIG. 4b is a side or elevation view of the assembled structure of FIG. 4a, differing therefrom only in the number of apertures provided for signal paths through the cold plate.

According to an aspect of the invention, the edges 414aRF and 414bRF of LRUs 410a and 410b, respectively, of FIG. 4a, are physically and thermally coupled to a vertically oriented, generally planar cold plate 460, through which coolant is capable of flowing by way of a set 461 of apertures, which set includes apertures 461a and 461c. The plane of cold plate 460 lies parallel with the plane of the antenna ground structure 440, so cold plate 460 may be viewed as being physically "between" the LRUs 410a, 410b, . . . and the antenna array including ground structure 440 and set 450 of antenna elements. A set 462 of apertures provides paths for the coupling of electromagnetic energy between the TR modules 412aa, 412ab, . . . of a set 412 of TR modules of the various LRUs 410a, 410b, . . . through cold plate 460 to a set 416 of circulators. The thermal connection of the LRUs 410a and 410b to the cold plate in FIGS. 4a and 4b is by way of LRU edges such as edge 414aRE. The thermal path occasioned by such a mounting is such that all four TR modules of each LRU are equidistant from the cold plate, and have virtually identical paths for the flow of heat between a TR module and the cold plate. This identical heat path arrangement, in turn, results in substantially equal thermal resistance or thermal impedance between each TR module and the cold plate. Assuming that the temperature of the cold plate is the same over the entirety of its relevant surface, the result is that all the TR modules of an LRU (and by extension all the TR modules of the array antenna) tend to be at the same temperature. The equality of temperature reduces or eliminates those performance deficiencies which are occasioned by temperature differences among the TR modules. Thus, the mounting of the plane of the cold plate 460 parallel with the ground "plane" structure 440, with both orthogonal to the plane of the baseplates 414 of the various LRUs tends to provide equal TR module temperatures.

According to another aspect of the invention, the thermal paths on each LRU between the TR modules and the heat extraction interface at the radio frequency edge of the LRU is shortened by a dimension of a circulator. This is accomplished by physically moving the circulators from the LRU to another structure lying between the cold plate and the ground plane structure of the array antenna, thereby allowing the TR modules of each LRU to be moved closer to the heat transfer edge, such as edge 414aRE, of the module.

There is one circulator in set 416 for each TR module of set 412 of FIG. 4a. In general, as described in conjunction with FIGS. 1 and 2, each circulator is coupled to its associated antenna element by means of a single electromagnetic signal path of a set 472 of electromagnetic signal paths, and both received signals and signals to be transmitted flow on that single signal path. Thus, in FIG. 4b, antenna element 450a is coupled to a single bidirectional signal path 472a, antenna element 450b is coupled to a single bidirectional signal path 472b, antenna element 450c is coupled to a single bidirectional signal path 472c, and antenna element 450d is coupled to a single bidirectional signal path 472d. However, the TR module, in general, can be expected to include both transmission or power portions and receive portions, and these are not, generally speaking, bidirectional. Thus, the signals received by an antenna element must be coupled to the receive portion of the associated TR module by a dedicated path, and the signals to be transmitted by an antenna element exit from the corresponding TR module on a dedicated path. Referring to FIG. 4b, each TR module of set 412 of TR modules is seen to be associated with two signal paths related to the corresponding antenna element, one for "forward" direction or transmission signal flow and the other for "reverse" direction or receive signal flow. The set of forward and reverse signal paths is designated generally as 470 in FIGS. 4a and 4b. The forward direction signal flow paths include path 470aF associated with TR module 412aa, path 470bF associated with TR module 412ab, path 470cF associated with TR module 412ac, and path 470dF associated with TR module 412ad. The reverse direction signal flow paths include path 470aR associated with TR module 412aa, path 470bR associated with TR module 412ab, path 470cR associated with TR module 412ac, and path 470dR associated with TR module 412ad.

The routing of the signals flowing in FIG. 4a in a unidirectional manner on each of signal flow paths 470aF, 470aR; 470bF, 470bR; 470cF, 470cR, and 470dF, 470dR between (electrical context) TR modules 412aa, 412ab, 412ac, and 412ad, respectively, and the bidirectional signal paths 472a, 472b, 472c, and 472d associated with antenna elements 450a, 450b, 450c, and 450d, respectively, is performed by set 416 of circulators. As known in the art, the circulator circulates signals entering a given port to the next adjacent port in a particular direction, and thus "automatically" routes signals to be transmitted from the transmit portion of the TR module to the associated antenna element, and signals received by the antenna element to the receive portion of the associated TR module. It should be noted that the use of the term "between" in this particular context relates to the electrical meaning of the term, rather than to the physical meaning; in the electrical context, signals flow between two elements by any path, including paths which are not physically between the elements. Thus, it is only necessary to make connections of the bidirectional-, forward- and reverse-direction signal flow paths to the appropriate ports of a circulator in order to achieve the desired routing.

The above description of the TR module, circulator, and antenna element makes it clear that a single path for electromagnetic radiation runs between the circulator to the associated antenna element, but that two such paths run between the circulator and the TR module, one for each of transmit and receive signals. In general, it is desirable at the frequencies at which antenna elements operate to keep electrical signal paths or transmission lines short, to reduce losses. Consequently, it is desirable for the electromagnetic signal paths to pass through the cold plate, rather than to extend around its edge. As a result, either one aperture capable of accommodating two electromagnetic signal paths or transmission lines, or two separate apertures, each capable of accommodating a single transmission line, must be provided through the cold plate for each TR module and its associated circulator.

Thus, according to another aspect of the invention, the LRUs such as 410a of FIGS. 4a and 4b are physically separated from the associated circulators, such as circulators of set 416, by the cold plate 460, but the radio frequency connections are maintained by connections or signal paths of set 470 extending through the cold plate. In FIG. 4a, set 470 of signal paths extends through a set 462 of apertures in the cold plate 460, with one aperture for each electromagnetic signal path. Thus, set 462 of apertures of FIG. 4a includes two separate apertures associated with each circulator of set 416 of circulators. More particularly, apertures 462a1 and 462a2 are associated with TR module 412aa and with circulator 416a, apertures 462b1 and 462b2 are associated with TR module 412ab and with circulator 416b, apertures 462c1 and 462c2 are associated with TR module 412ac and with circulator 416c, and apertures 462d1 and 462d2 are associated with TR module 412ad and with circulator 416d. The arrangement of FIG. 4b differs slightly from that of FIG. 4a, in that the dimensions of the apertures in the cold plate in FIG. 4b are selected to merge, so as to accommodate two separate signal transmission paths, which may be in the form of coaxial transmission lines, for example. Thus, in FIG. 4b, aperture 462i extending through cold plate 460 accommodates both forward direction signal path 470aF and reverse direction signal path 470aR, aperture 462ii extending through cold plate 460 accommodates both forward direction signal path 470bF and reverse direction signal path 470bR, aperture 462iii extending through cold plate 460 accommodates both forward direction signal path 470cF and reverse direction signal path 470cR, and aperture 462iv extending through cold plate 460 accommodates both forward direction signal path 470dF and reverse direction signal path 470dR. As mentioned above, each signal path may be a coaxial transmission path, or as an alternative it could be a waveguide path. In the context of a lidar (the light equivalent of a radar) system, the signal paths might even be optical fibers.

Figure 5:
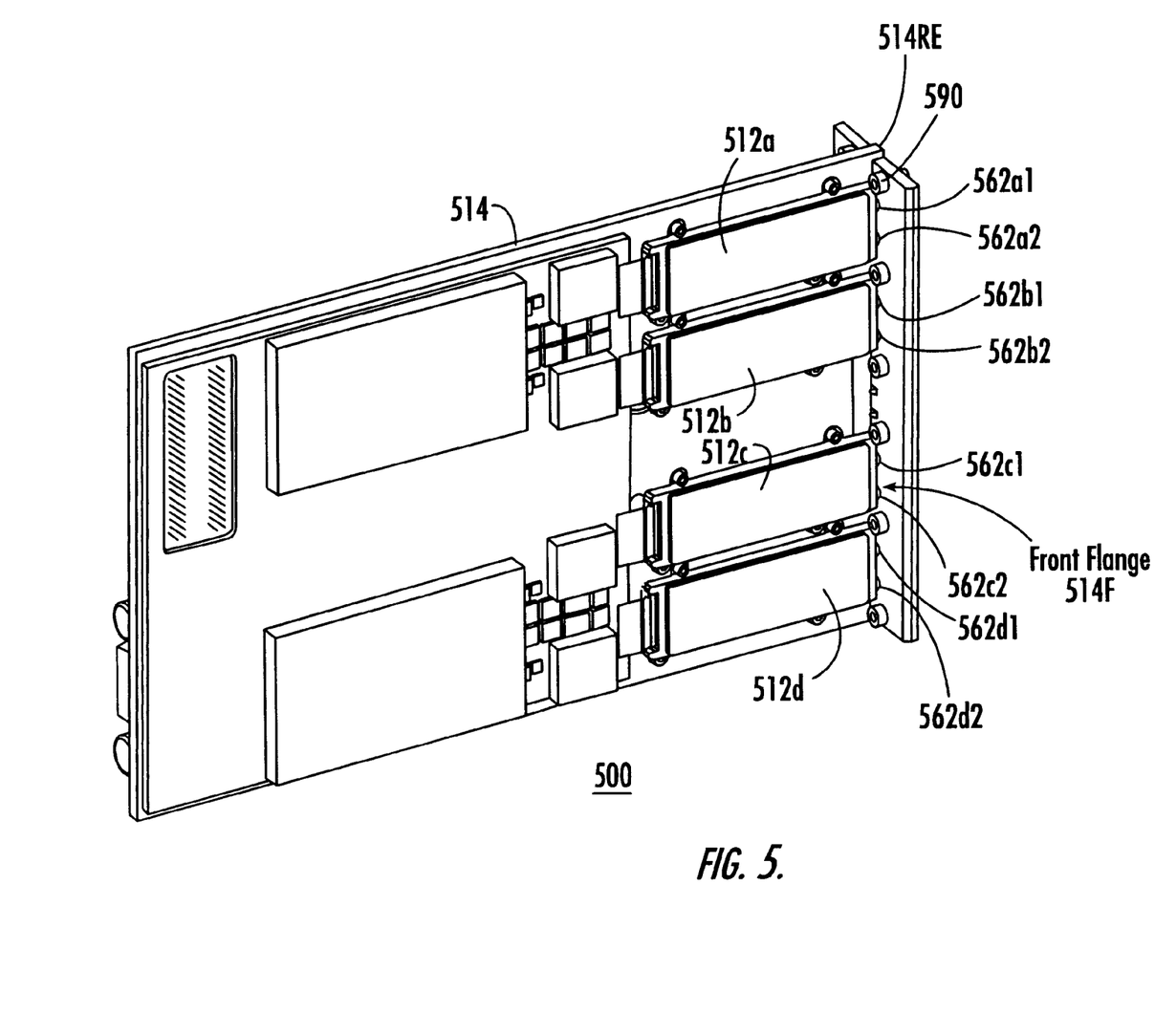
FIG. 5 is a simplified perspective or isometric view of a line replaceable unit (LRU) which includes a mounting flange by which convenient mounting of the LRU to a cold frame may be made.
Figure 6:
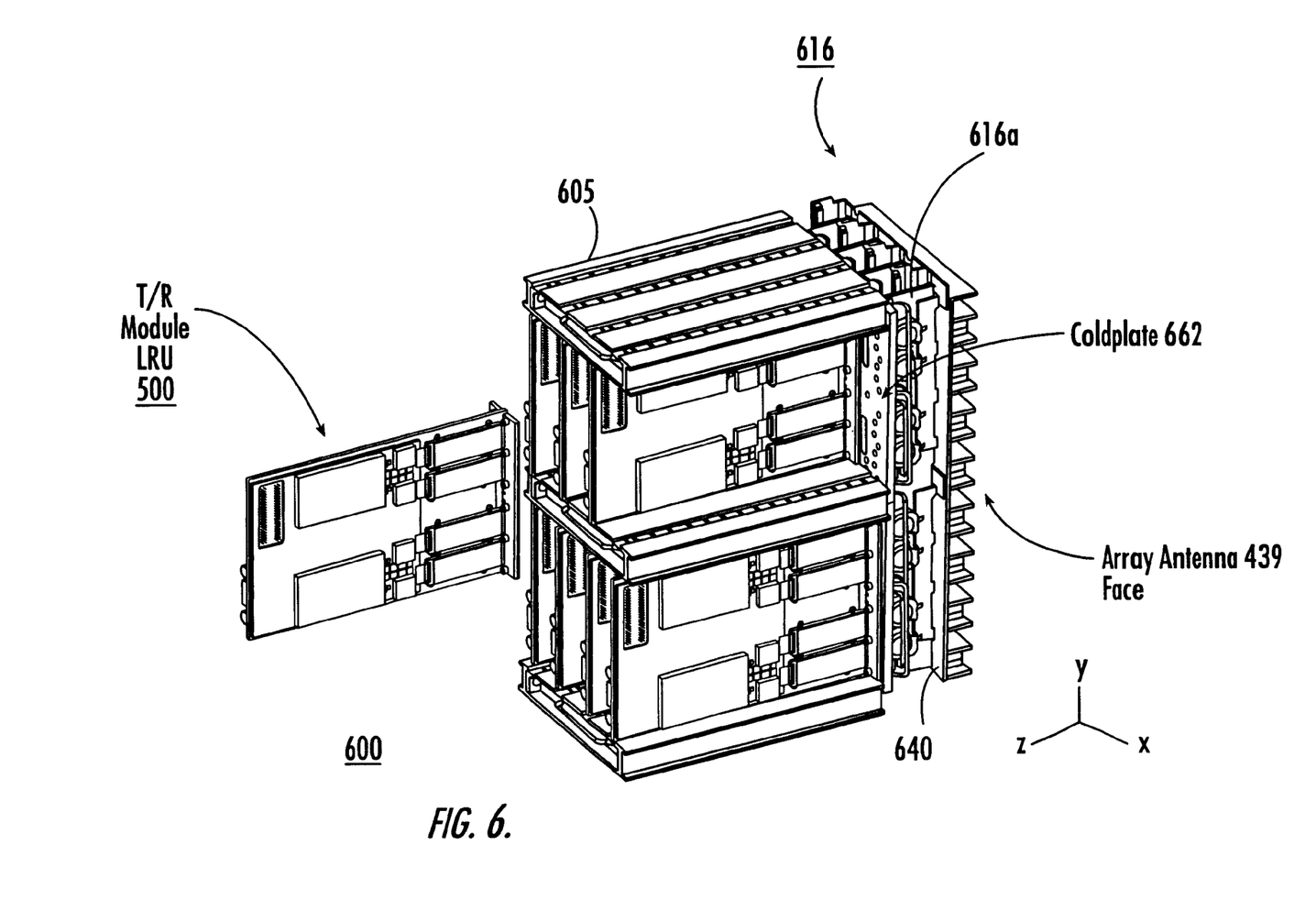
FIG. 6 is a simplified perspective or isometric illustration of an active array antenna arrangement including a line replaceable unit (LRU) support structure arranged to accommodate a plurality of LRUs, one of which is shown exploded away from the assembly.

FIG. 5 is a simplified perspective or isometric view of a line replaceable unit (LRU) 500 which includes a mounting flange by which convenient mounting of the LRU to the cold frame (not illustrated) may be made. In FIG. 5, LRU 500 includes a baseplate 514. Baseplate 514 is affixed to, or unitary or monolithic with, a front flange 514F, which is designed to abut a cold plate, such as cold plate 460 of FIGS. 4a and 4b. Flange 514F is associated with a plurality of captive screws, one of which is illustrated as 590, which can be threaded into corresponding threaded apertures (not illustrated) in the associated cold plate, to firmly affix the flange to the cold plate, and thereby provide a good thermal contact which reduces thermal resistance relative to a less well affixed connection. Baseplate 514 of LRU 500 supports four TR modules 512a, 512b, 512c, and 512d of a set 512 of TR modules, which modules are mounted immediately adjacent to the thermal sink end 514RE of baseplate 514 and to flange 514F, without any space devoted to circulators. As may be noted, the arrangement of FIG. 5 includes a plurality of apertures, two for each TR module, for the passage of electromagnetic energy to the circulators (not illustrated in FIG. 5). Apertures 562a1 and 562a2 are associated with TR module 512a, apertures 562b1 and 562b2 are associated with TR module 512b, apertures 562c1 and 562c2 are associated with TR module 512c, and apertures 562d1 and 562d2 are associated with TR module 512d. FIG. 6 illustrates an active array antenna arrangement 600 including a line replaceable unit (LRU) support structure 605, arranged to accommodate a plurality of LRUs 500, one of which is shown exploded away from the assembly. A cold plate 662 lies in a plane parallel with the plane of the antenna array 439. Between the cold plate 662 and the ground plane 640 of the array antenna 439 lies an array 616 of printed circuit boards 616aa supporting and providing electrical paths to the circulators.

Figure 7A:
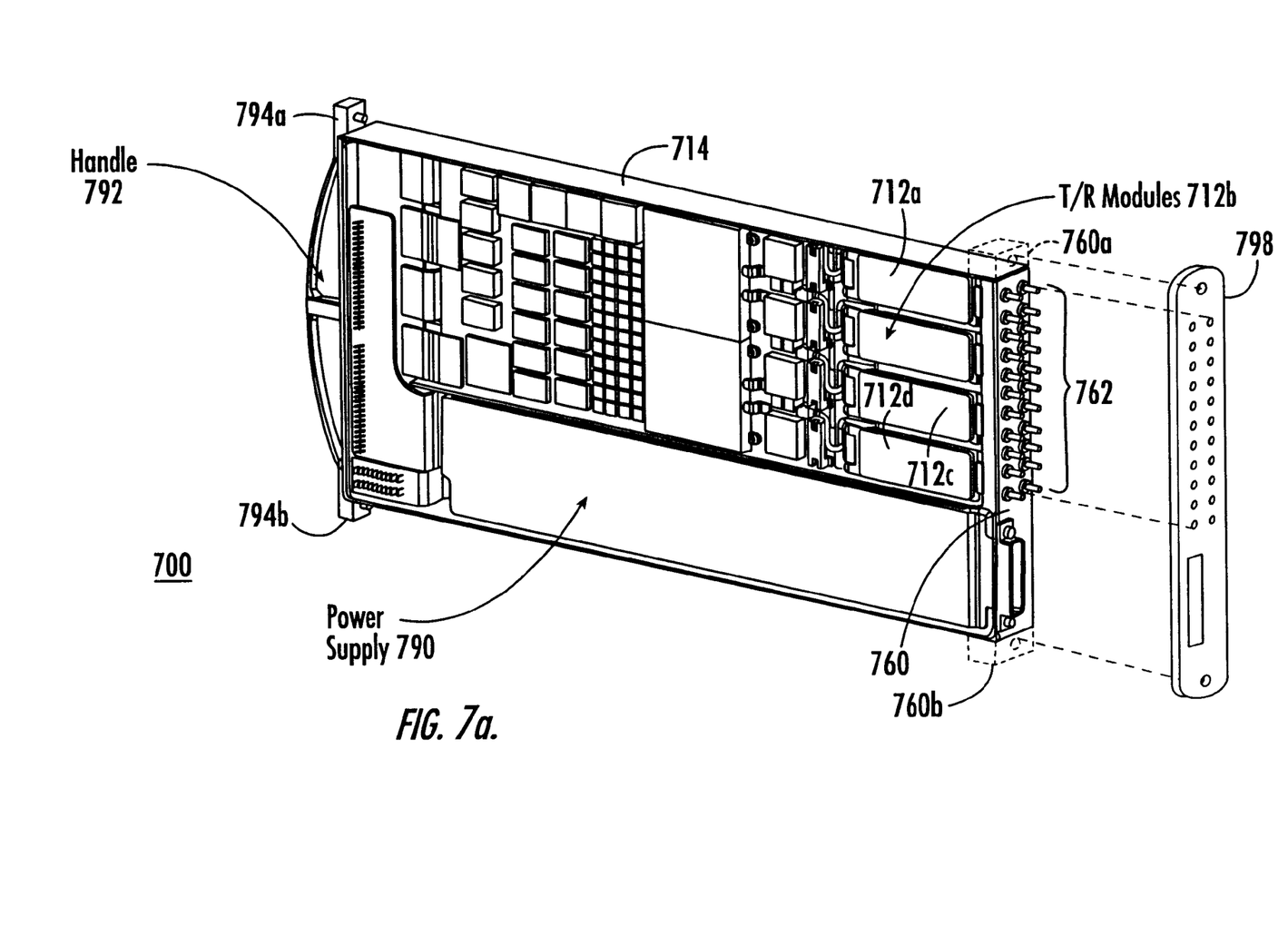
FIG. 7a is a simplified perspective or isometric illustration of an LRU according to another aspect of the invention, including RF connectors.

In FIG. 7a, another embodiment of an LRU 700 includes a set 712 of eight TR modules (only four of which are visible on the illustrated side), some of which are designated 712a, 712b, 712c, and 712d, mounted on a baseplate 714. In the arrangement of FIG. 7a, the baseplate includes a solid metal plate milled (or "hogged") into a complex shape to accept the various components, including the power supply 790. In the embodiment of FIG. 7a, the set of TR modules lies adjacent to the "front" flange 760, and the circulators (not illustrated in FIG. 7a) which are intended to be associated with the TR modules of set 712 are mounted elsewhere, as described in conjunction with FIG. 4a. Thus, each TR module of set 712 requires two RF connectors for connection to its off-LRU circulator. In FIG. 7a, a set 762 of twenty-two RF connectors is more than adequate to meet the need. At the rear or access side of the line-replaceable unit 700, a handle 792 provides purchase for withdrawing the unit 700 from engagement with those connectors (not illustrated) with which the connectors of set 762 mate. A pair of front flange extensions 794a and 794b are fitted with screws by which the LRU 700 can be held into a framework, and the screws provide positive retention. If desired, additional flange extensions and associated screws can be provided to the front flange 760, as suggested by phantom blocks 760a and 760b, to provide additional support for maintaining the front flange in intimate contact with the cold plate to which it is fastened when in operation. In addition, it may be desirable to provide a resilient, thermally conductive gasket such as gasket 798 to aid in filling unavoidable microvoids between the front surface of flange 760 and the facing surface (not illustrated) of the associated cold plate (also not illustrated).

One such gasket material is a 0.010" thick GraFoil material.

Figure 7B:
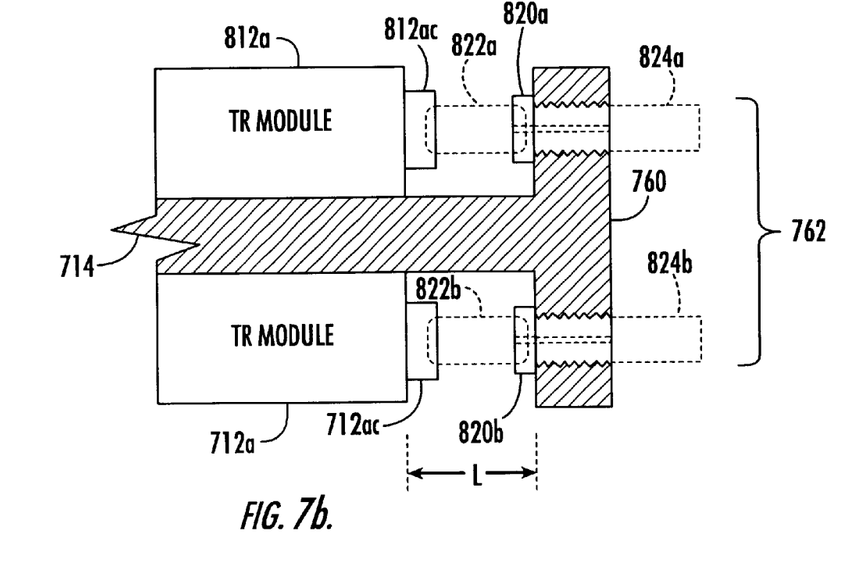
FIG. 7b is a simplified cross-sectional view illustrating how the RF connectors are connected to the TR modules of FIG. 7a, and FIGS. 7c and 7d are line illustrations of suitable connectors for use in the arrangement of FIG. 7b.
Figure 7C:
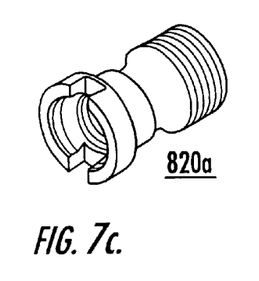
Figure 7D:
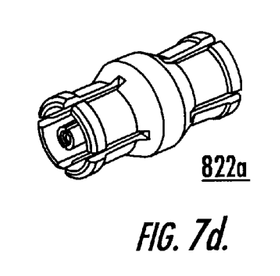

FIG. 7b is a cross-sectional view of a portion of the arrangement of FIG. 7a. In FIG. 7b, TR module 712a of FIG. 7a is seen to be mounted on a portion of baseplate 714, set back by a distance designated as L from a face of flange 760. TR module 812a, which is not visible in FIG. 7a, is visible in FIG. 7b, and is mounted on the opposite side of baseplate 714 from module 712a. Module 812a is similarly set back by distance L from a face of flange 760. Each module 712a, 812a has an RF connector or port 712ac, 812ac, respectively, in the plane of FIG. 7b. A pair of thread-in RF connector adaptors 820a and 820b are threaded into suitable threaded apertures in flange 760, in registry or axial alignment with module RF connectors 712ac and 812ac, respectively. FIG. 7c is a perspective or isometric view of a suitable thread-in RF connector adapter 820a, namely type GPPO male to GPPO male thread-in adaptor made by Gilbert Engineering Co. Naturally, any suitable connector suite may be used. In the arrangement of FIG. 7b, connection is made between the TR module connectors 712ac, 812ac and RF connector adapters 820b, 820a, respectively, by a pair of "bullet" or blind connection RF interconnects 822a, 822b, which merely slip into place during assembly of the TR module to the baseplate 714. FIG. 7d is a perspective or isometric view of bullet connector 822a, which is also GPPO connector from Gilbert Engineering. Further bullet adapters 824a and 824b may be used to make connection to the other ends of connectors 820a, 820b.

Other embodiments of the invention will be apparent to those skilled in the art. For example, it will be apparent that the cold plate may be located in a plane lying between the array of TR modules and the array of antenna elements without the relocating of the circulators, thereby requiring but a single electromagnetic path through the cold plate for each TR module, and still achieving substantial equalization of TR module temperature by comparison with the prior art arrangement, but with somewhat higher temperatures of the modules than if the thermal path length between the TR modules and the heat sink were reduced by the dimensions of the circulators. While the antenna elements of the antenna array as illustrated are dipoles, those skilled in the antenna arts know that other antenna elements may be used.

Thus, an active array antenna (400; 600) according to an aspect of the invention includes a plurality of RF modules (set 412; set 512) having at least transmit capability. Each of the modules (of sets 412; 512), when energized, generates heat, and transfers the heat to a generally planar mounting and heat transfer surface (such as 13a) of the module (such as 12a). The active array antenna (400; 600) also includes a plurality of thermally conducting, generally planar mounting and heat transfer plates (414; 514), each of which mounting and heat transfer plates (414; 514) defines at least one generally straight edge (514RE). Each of the mounting and heat transfer plates (414; 514) includes mounting positions for at least three (four illustrated) of the modules (412; 512). These mounting positions are arrayed in a straight line (8) parallel to the straight edge (414are; 514RE). As a result, or whereby, if heat is extracted from the mounting and heat transfer plates (414a; 514) in a direction collinear with the straight-line array direction (8), those of the modules (12), if any, nearest the heat extraction regions will have a lower temperature than others of the modules (12) more remote from the heat extraction regions. The active array antenna (400; 600) includes a mounting structure (405; 605) for mounting the plurality of generally planar mounting and heat transfer plates (414a, 414b; 514; 714) in a side-by-side array, with the straight edges (514RE, for example) of the mounting and heat transfer plates (414a, 414b; 514; 714) lying in a plane. A generally planar cold plate (460; 662) abuts, and is in thermal contact with, the straight edges (such as 514RE) of the mounting and heat transfer plates (414a, 414b; 514; 714), for extracting heat from the mounting and heat transfer plates (414a, 414b; 514; 714) in a direction orthogonal to the module array direction (8), which thereby tends to maintain all of the modules at the same temperature.

In a particular embodiment of the invention, each of the modules (12; 700) includes at least an RF output port (12ao or 812ac, for example), and the mounting and heat transfer plates (414a, 414b; 514; 714) include RF coupling means (820a, 820b, 822a, 822b), for coupling RF from (a) the positions of the RF output ports (12ao or 812ac, for example) of the modules associated with the mounting and heat transfer plate (414a, 414b; 514; 714) when the modules are mounted at the mounting locations to (b) locations adjacent the straight edge (such as 514RE) of the mounting and heat transfer plate (414a, 414b; 514; 714).

What is claimed is:

1. An array, comprising:

a plurality of RF modules having at least transmit capability, each of said modules, when energized, generating heat and transferring said heat to a generally planar mounting and heat transfer surface of the module;

a plurality of thermally conducting, generally planar mounting and heat transfer plates, each of said mounting and heat transfer plates defining at least one generally straight edge, each of said mounting and heat transfer plates including mounting positions for at least three of said modules, said mounting positions being arrayed in a straight line parallel to said straight edge, whereby, if heat is extracted from said mounting and heat transfer plates in a direction collinear with said straight-line array, those of said modules nearest the heat extraction regions will have a lower temperature than others of said modules more remote from said heat extraction regions;

a mounting structure for mounting said plurality of generally planar mounting and heat transfer plates in a side-by-side array, with said straight edges of said mounting and heat transfer plates lying in a plane; and a generally planar cold plate abutting and in thermal contact with said straight edges of said mounting and heat transfer plates, for extracting heat from said mounting and heat transfer plates in a direction orthogonal to said array direction, thereby tending to maintain all of said modules at the same temperature.

2. An array according to claim 1, wherein each of said modules includes at least an RF output port; said array further comprising:

RF coupling means associated with each of said mounting and heat transfer plates for coupling RF from the positions of said RF output ports of said modules associated with the heat transfer plate when said modules are mounted at said mounting locations to locations adjacent said straight edge of said mounting and heat transfer plate.

* * * * *